(12) United States Patent
Gatta

(10) Patent No.: US 7,772,930 B2
(45) Date of Patent: Aug. 10, 2010

(54) CALIBRATION TECHNIQUES FOR PHASE-LOCKED LOOP BANDWIDTH

(75) Inventor: Francesco Gatta, Laguna Niguel, CA (US)

(73) Assignee: Broadcom Corporation, Irvine, CA (US)

(*) Notice: Subject to any disclaimer, the term of this patent is extended or adjusted under 35 U.S.C. 154(b) by 137 days.

(21) Appl. No.: 11/398,787

(22) Filed: Apr. 6, 2006

(65) Prior Publication Data
US 2007/0247235 A1    Oct. 25, 2007

(51) Int. Cl.
*H03L 7/093*    (2006.01)
*H03L 7/12*    (2006.01)

(52) U.S. Cl. .................... 331/16; 331/179; 327/157
(58) Field of Classification Search .................. 331/16, 331/17, 18, 25, 34, 1 A, 44, 175, 177 R, 179; 327/156, 157
See application file for complete search history.

(56) References Cited

U.S. PATENT DOCUMENTS

| | | | | |
|---|---|---|---|---|
| 5,448,763 A | * | 9/1995 | Gillig | 455/76 |
| 5,625,325 A | * | 4/1997 | Rotzoll et al. | 331/16 |
| 5,631,587 A | * | 5/1997 | Co et al. | 327/107 |
| 6,583,675 B2 | * | 6/2003 | Gomez | 331/17 |
| 7,019,598 B2 | | 3/2006 | Duncan | |
| 2003/0206065 A1 | * | 11/2003 | Gomez | 331/16 |
| 2004/0109521 A1 | * | 6/2004 | Jeong et al. | 375/376 |
| 2005/0048939 A1 | | 3/2005 | McMullin | |
| 2006/0158264 A1 | * | 7/2006 | Kousai et al. | 331/16 |

* cited by examiner

*Primary Examiner*—Robert Pascal
*Assistant Examiner*—Ryan Johnson
(74) *Attorney, Agent, or Firm*—Brake Hughes Bellermann LLP

(57) ABSTRACT

Various embodiments are disclosed relating to calibration techniques for a phase-locked loop (PLL) bandwidth. According to an example embodiment, a calibration technique may include calibrating a voltage-controlled oscillator (VCO) of a phase-locked loop (PLL) circuit, and calibrating a bandwidth of the PLL circuit based on the calibrating the VCO.

9 Claims, 2 Drawing Sheets

PLL 100

CALIBRATION TECHNIQUES FOR PHASE-LOCKED LOOP BANDWIDTH

BACKGROUND

A phase-locked loop (PLL) is a building block of local oscillator (LO) generation, clock generation and recovery, frequency synthesizers and other communications circuits. Some performance characteristics of a PLL may include the output phase noise, range of covered frequencies, tracking bandwidth, locking time, external spur rejection, and stability. The performance characteristics of a PLL may, at least in part, be determined by the PLL bandwidth. In some cases, a PLL may be designed or even optimized to operate at a certain point, e.g., with a specific known bandwidth and other parameters that may provide a specific performance, such as providing good noise immunity and spur rejection, etc.

A number of factors may vary or change, such as PLL operating frequency, semiconductor process, or environmental conditions such as supply voltage and temperature, that may impact or change the PLL bandwidth. Unfortunately, if a PLL bandwidth changes, the PLL performance may degrade or may even become unstable. Therefore, it may be desirable to provide a technique to calibrate or re-adjust a PLL bandwidth, e.g., to compensate for one or more varying factors or conditions.

SUMMARY

Various embodiments are disclosed relating to communications circuits, and also relating to calibration techniques for phase-locked loop (PLL) circuits.

According to an example embodiment, a method is provided that includes: calibrating a voltage-controlled oscillator (VCO) of a phase-locked loop (PLL) circuit, and calibrating a bandwidth of the PLL circuit based on the calibrating the VCO. The calibrating of the VCO may include, for example, determining an updated VCO setting to set input control voltage to the VCO substantially equal to a reference voltage for a specific VCO output frequency, and applying the updated VCO setting to the VCO. The calibrating the bandwidth of the PLL may include, for example, identifying (or determining) a charge pump current setting that corresponds to the updated VCO setting, and applying the identified charge pump current setting to the PLL circuit. According to another example embodiment, a phase-locked loop (PLL) circuit is provided. The PLL may include a phase frequency detector/charge pump (PFD/CP) circuit adapted to provide a charge pump current, a voltage controlled oscillator (VCO) having an input voltage coupled to an output of the PFD/CP circuit. The VCO may generate a VCO output frequency based on the input voltage. The apparatus may also include a control circuit coupled to the PLL circuit. The control circuit may perform a calibration on the VCO, and calibrate a bandwidth of the PLL circuit based on the calibration of the VCO.

DETAILED DESCRIPTION

Figure 1:
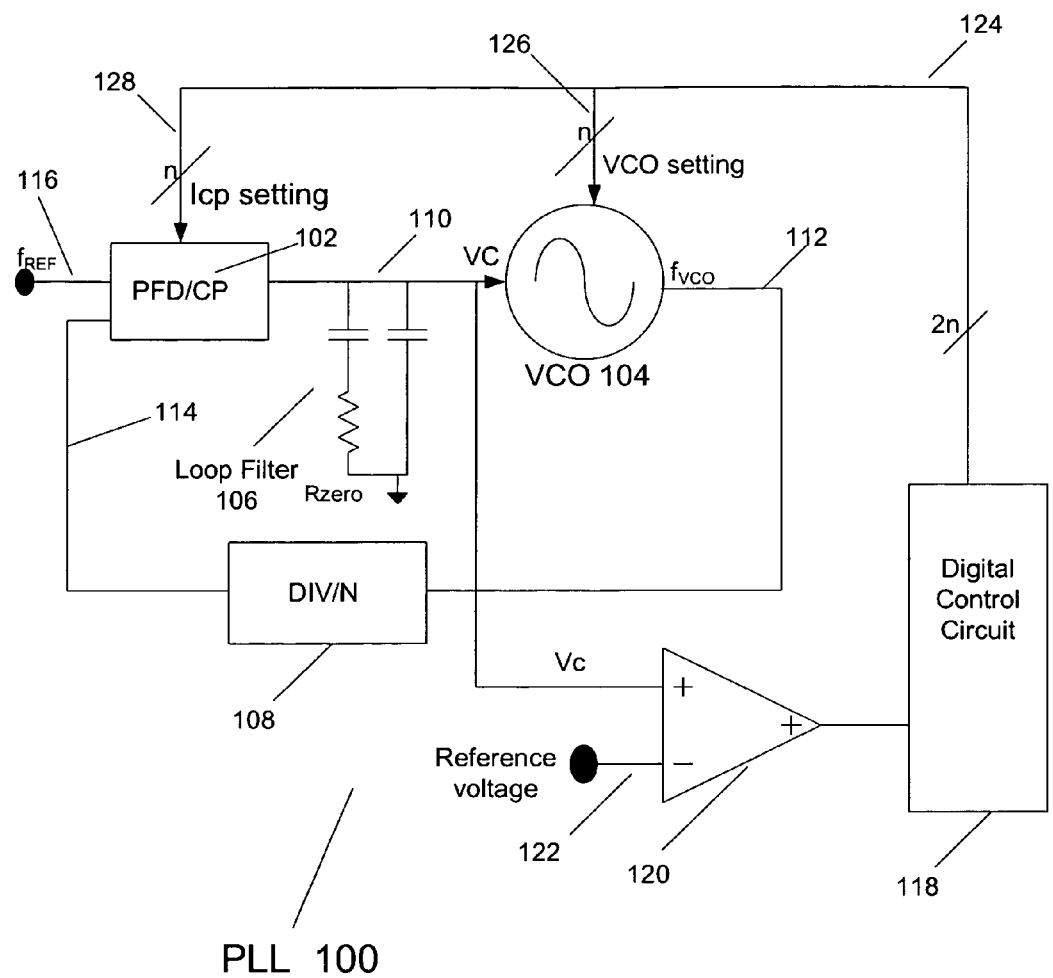
FIG. 1 is a block diagram of an apparatus according to an example embodiment.

FIG. 1 is a block diagram illustrating an apparatus according to an example embodiment. A phase-locked loop (PLL) 100 is shown in FIG. 1. PLL 100 may include a phase-frequency detector and charge pump (PFD/CP) circuit 102, and a voltage controlled oscillator (VCO) 104. A loop filter 106 (e.g., which may include capacitors and one or more resistors as shown, such as Rzero) is coupled between PFD/CP circuit 102 and VCO 104. PLL 100 may also include a frequency divider 108 coupled between an output of VCO 104 and an input to PFD/CP circuit 102.

VCO 104 may generate an output frequency ($f_{VCO}$) on line 112 based upon a VCO input control voltage (Vc) provided via line 110. VCO 104 may include a gain (Kvco) that may be described, for example, as the change in VCO output frequency per change in input VCO input control voltage (Vc), which may be represented as $\Delta f_{VCO}/\Delta Vc$, for example. VCO 104 may be programmable or adjustable, and may include, for example, one or more adjustable resistors, capacitors, inductors or other elements which may be adjusted to control VCO 104 to oscillate at a different frequency for a given control voltage Vc. For example, VCO 104 may include a number of resistors in parallel to a fixed resistor as part of a Ring oscillator, with the number of resistors in parallel being programmable or adjustable. Or VCO 104 may include one or more variable capacitors in a LC oscillator that may be adjusted or switched in or out, etc., to vary or adjust the VCO output frequency $f_{VCO}$ for a given input control voltage Vc, according to an example embodiment. These are merely some examples, and other variations or implementations may be used.

The VCO output frequency $f_{VCO}$ on line 112 is frequency divided by frequency divider 108 (by a number N which may be varied) to produce a frequency divided signal on line 114. PFD/CP circuit 102 receives the frequency divided signal as a first input via line 114 and a reference frequency signal $f_{REF}$ as a second input via line 116. The PLL 100 may typically operate to drive the VCO output frequency $f_{VCO}$ to a frequency based on the reference frequency signal $f_{REF}$ input via line 116 and the divider number N, as shown by the equation:

$$f_{VCO} = f_{REF} * N. \quad \text{(Eqn. 1).}$$

The PFD (phase frequency detector) of PFD/CP circuit 102 may generate an output signal(s), for example, based on a phase difference between its two input signals (the divided frequency signal via line 114 and $f_{REF}$ via line 116). For example, an up signal or a down signal may be output by the PFD based on whether the divided frequency signal on line 114 leads or lags the reference frequency signal $f_{REF}$, respectively (which may indicate a difference in frequency between these two signals). The charge pump (CP) of PFD/CP circuit 102 may generate positive or negative charge pulses or charge pump current (Icp) onto line 110 based on whether the divided frequency signal on line 114 leads or lags the reference frequency signal $f_{REF}$, respectively, for example. Loop filter 106 may integrate or accumulate the charge pulses or charge pump current (Icp) to generate a control voltage Vc on line 110 (e.g., charge pump current Icp across resistor Rzero may provide a voltage Vc), which may indicate an amount that divided frequency signal leads or lags the reference frequency signal $f_{REF}$. The control voltage Vc may control or adjust the frequency $f_{VCO}$ output by VCO 104.

According to an example embodiment, in a charge pump PLL with a second order loop filter, the PLL bandwidth (or cutoff frequency) may be simplified or described by the equation:

$$\text{PLL BW} = (\text{Icp} * \text{Rzero} * \text{Kvco})/N. \quad \text{(Eqn. 2).}$$

Where Icp is the charge pump current, Rzero is the resistor (or zero resistor) for the loop filter, Kvco is the gain of the VCO and N is the frequency divider number. This is merely one example embodiment and is used to illustrate various aspects and techniques, and other PLLs and equations may be used. Thus, it can be seen that if, for example, the VCO gain (Kvco) varies due to a change in semiconductor process or variation in voltage or temperature, this will change the PLL bandwidth (and may degrade PLL performance as noted above). Likewise, if N is changed in order to control the VCO to output a different VCO output frequency $f_{VCO}$, the PLL bandwidth will change accordingly. For instance if the frequency divider number N doubled to 2N, the PLL bandwidth may typically be halved (approximately), and performance of the PLL may typically degrade, such as an increase in phase noise, for example. Therefore, according to an example embodiment, the PLL bandwidth may be calibrated to compensate for one or more changes or variations maintain more consistent PLL performance.

In addition, a change in a semiconductor process or a variation in one or more environmental conditions (e.g., supply voltage, temperature or other factors) may also impact or change the VCO gain (Kvco). A VCO may be designed to operate well (e.g., optimized) at a specific operating point, where a specific VCO output frequency $f_{VCO}$ will be generated by the VCO based on a specific input control voltage Vc. Unfortunately, a change in the VCO gain may typically move the VCO from such a designed or optimized operating point, and PLL and VCO performance may degrade. In other words, such a change or variation may, in some cases, alter the Kvco, which may then typically cause the VCO to produce a different output frequency $f_{VCO}$ for the same control voltage Vc, which may be undesirable since this may mean that the VCO is no longer operating at its designed or optimized operating point (and performance may suffer). Thus, according to an example embodiment, the VCO 104 may be calibrated to compensate for variations in semiconductor process, environmental conditions, etc.

According to an example embodiment, VCO 104 may be calibrated. Various examples of a VCO calibration will now be described. The bandwidth of PLL 100 may then be calibrated based on the calibrating the VCO 104. In an example embodiment, a digital control circuit 118 may control the overall calibration process, e.g., control the VCO calibration and the PLL bandwidth calibration. A comparator 120 may compare the VCO input voltage Vc to a reference voltage received via line 122 and output a difference signal to control circuit 118, for example. In an example embodiment, the reference voltage received via line 122 may be a value of the VCO control voltage Vc that corresponds, for example, to a good or optimized operating point for a specific output frequency $f_{VCO}$, that should be maintained if possible, for example.

In order to calibrate the VCO 104, control circuit 118 may output a VCO setting (which may be digital signal of n bits, for example) via line 124 and line 126 to VCO 104. The VCO setting may specify one or more parameters for VCO 104, such as adjust a resistor(s), capacitor(s), inductor(s), etc. within VCO 104. For example, the VCO setting may include n bits, with each bit specifying whether a resistor will be provided in parallel, to adjust a resistance value, etc. Likewise, the bits of the VCO setting may be used to adjust or vary a capacitance value or inductance value within VCO 104. These are merely some examples and the disclosure is not limited thereto.

According to an example embodiment, calibrating the VCO may include making an adjustment to the VCO setting (to adjust a VCO parameter) such that an input control voltage Vc to the VCO 104 will be substantially or approximately equal to the reference voltage for a specific VCO output frequency $f_{VCO}$. In an example embodiment, the calibrating the VCO may include determining an updated VCO setting to set an input control voltage Vc of the VCO 104 substantially equal to a specific voltage (e.g., reference voltage) for a specific VCO output frequency $f_{VCO}$. As noted, the updated VCO setting may provide a change to a value of one or more of a resistor, a capacitor, an inductor, or other component of the VCO 104.

According to an example embodiment, to calibrate VCO 104, control circuit 118 may first determine whether Vc is greater than the reference voltage. If Vc is greater than the reference voltage, then the VCO calibration process may stop since Vc is estimated to be near or substantially equal to the reference voltage. If Vc is less than the reference voltage, then the VCO setting applied to VCO 104 is increased, and the output of comparator 120 is checked again. If Vc is still less than the reference voltage, the VCO setting applied to VCO 104 is again increased. This process is repeated until Vc is greater than (or equal to) the reference voltage. This is merely one example implementation of a calibration process, and many others may be used.

According to an example embodiment, the VCO output frequency may be represented as:

$$f_{VCO} = Vc * Kvco + C0 \qquad (\text{Eqn. 3}).$$

where C0 is a constant. In this example, due to a variation in process or environmental condition, etc., Kvco changes to Kvco'. In one embodiment, the VCO calibration may be done, for example, by applying an updated VCO setting to the VCO as described above, which may, e.g., result in adjusting the constant C0 to a new constant C1 to compensate for the change to the VCO gain (Kvco), in equation 3. In other words a new constant C1 may be selected for VCO 104 by applying the updated VCO setting to compensate for the change in VCO gain, such that the input of the same control voltage Vc produces the same output frequency $f_{VCO}$, even though the gain of the VCO is different, according to an example embodiment. Thus, the new VCO setting may produce approximately the same VCO output frequency based on the following:

$$f_{VCO} = Vc * Kvco' + C1 \qquad (\text{Eqn. 4})$$

where Kvco' is the new (varied) VCO gain due to variation in process, or environmental condition, and C1 is the new constant provided by the VCO 104 in response to an updated VCO setting. This is merely one example illustrating how a VCO may be calibrated, and the disclosure is not limited thereto. Other aspects of the VCO may be adjusted or calibrated as well.

Various example embodiments of a PLL bandwidth calibration will now be described. Digital control circuit 118 may also output a charge pump current (Icp) setting (e.g., which may be an n bit digital signal) to PFD/CP circuit 102 via lines 124 and 128. The Icp setting may be used, for example, to calibrate the PLL bandwidth. According to an example embodiment, after calibrating the VCO 104, the PLL bandwidth may be calibrated by adjusting the charge pump current Icp for the PLL based on the calibrating the VCO. As shown by Eqn. 2, an adjustment to Icp may be used to compensate for a variation in Kvco or N, while providing the same PLL bandwidth. (Eqn. 2 is repeated here: PLL BW= (Icp*Rzero*Kvco)/N). For example, calibration of the PLL bandwidth may include updating a charge pump current Icp an amount and direction (e.g., positive or negative adjustment) based on an amount and direction of the VCO setting (or VCO parameter) adjustment (performed in the VCO calibration). For example, the Icp (or Icp setting) may be adjusted an amount proportional to the change or adjustment to the VCO parameter (or VCO setting). In another example embodiment, each VCO setting may be mapped to one or more corresponding Icp settings. Once the VCO has been calibrated by providing an updated VCO setting, the corresponding Icp setting may be applied to calibrate the PLL bandwidth, for example.

In an example embodiment, the VCO setting may indicate a number of resistors provided in parallel to a fixed resistor. The higher the VCO setting indicates a lower total resistance, providing a higher VCO output frequency $f_{VCO}$ (for a given Vc). Such a VCO setting may compensate for process variation, e.g., higher VCO setting may be used for a slower process, and a lower VCO setting may be used for faster process. Thus, the VCO setting may provide information on the semiconductor process, and this information (the VCO setting) may be used to identify or determine a corresponding Icp setting that should be applied to calibrate the PLL bandwidth for such a process, for example. In an example embodiment, a common or same set of digital values may be used for VCO setting and Icp setting (since these are mapped to each other), thus allowing one group of settings to be used for both VCO setting and Icp setting.

In one example embodiment, Icp setting may use a 4-bit signal, each value of Icp corresponding to a current value, such as:

| Icp setting | Icp (micro-amps) |
|---|---|
| 0000 | 50 |
| 0010 | 50 |
| 0011 | 75 |
| 0100 | 75 |
| 0101 | 100 |
| 0111 | 100 |
| 1000 | 160 |
| 1001 | 160 |
| 1010 | 160 |
| 1011 | 160 |
| 1100 | 200 |
| 1101 | 200 |
| 1110 | 200 |
| 1111 | 200 |

Figure 2:
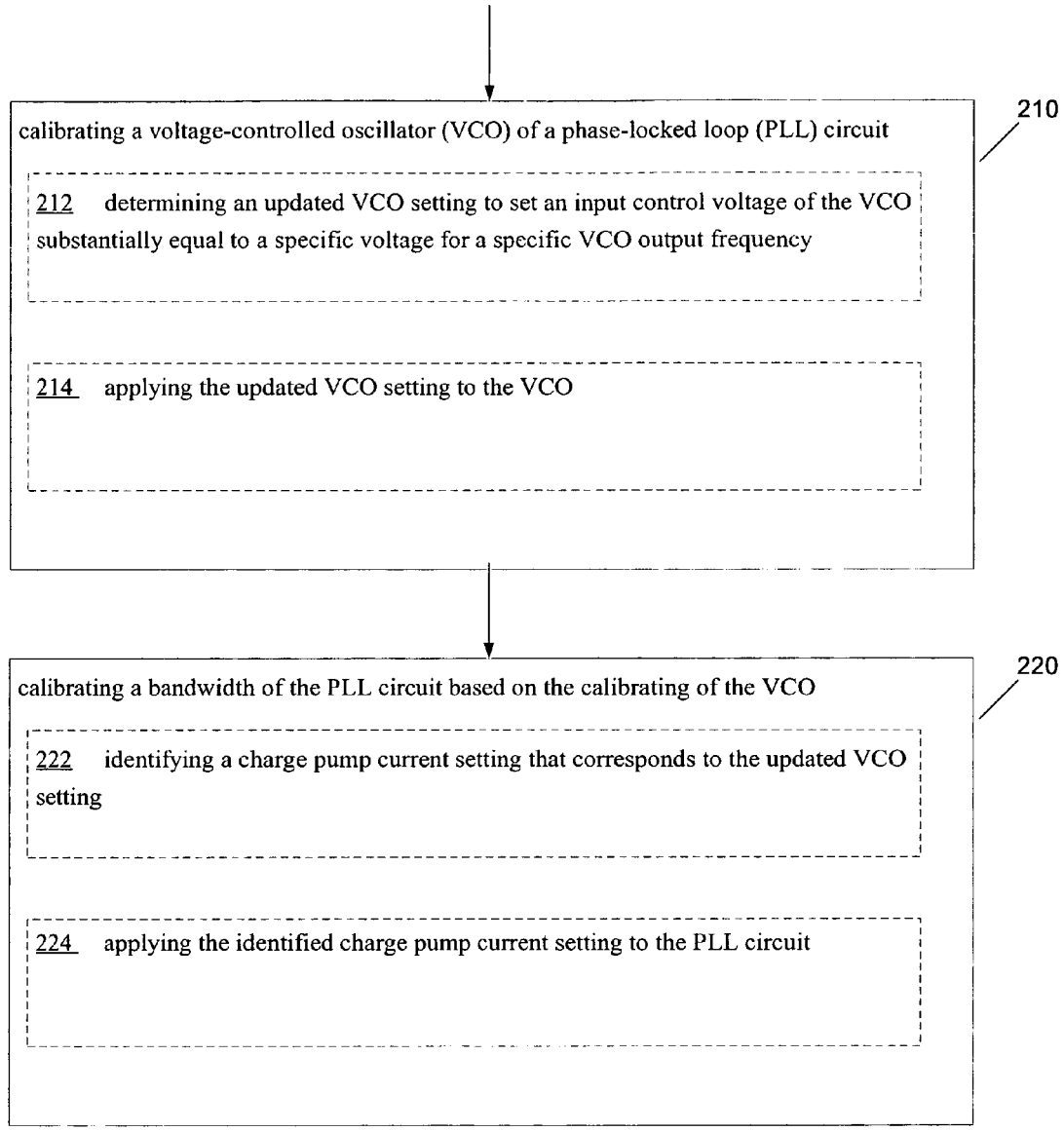
FIG. 2 is a flow chart illustrating operation of an apparatus according to an example embodiment.

FIG. 2 is a flow chart illustrating an operation of an apparatus according to an example embodiment. At 210, a voltage-controlled oscillator (such as VCO 104) of a phase-locked loop (PLL) circuit is calibrated. This may include, for example, determining an updated VCO setting to set an input control voltage (Vc) of the VCO substantially (or approximately) equal to a specific voltage for a specific VCO output frequency (212), and applying the updated VCO setting to the VCO (214). At 220, a bandwidth of the PLL circuit is calibrated based on the calibrating of the VCO. For example, this may include identifying a charge pump current setting that corresponds to the updated VCO setting (222), and then applying the identified charge pump current setting to the PLL circuit (224).

Therefore, according to an example embodiment, the PLL bandwidth may be calibrated based on a calibration of a VCO. This may allow, for example, more accurate control of the PLL bandwidth over a range of values, such as variations of semiconductor process, environmental conditions (such as voltage, temperature), divider number N, etc. This may allow a more stable PLL and VCO performance independent of such variations.

While certain features of the described implementations have been illustrated as described herein, many modifications, substitutions, changes and equivalents will now occur to those skilled in the art. It is, therefore, to be understood that the appended claims are intended to cover all such modifications and changes as fall within the true spirit of the various embodiments.

What is claimed is:

1. An apparatus comprising:
   a phase-locked loop (PLL) circuit, including:
      a phase frequency detector/charge pump (PFD/CP) circuit adapted to provide a charge pump current;
      a voltage controlled oscillator (VCO) having an input voltage coupled to an output of the PFD/CP circuit, the VCO adapted to generate a VCO output frequency based on the input voltage;
      a comparator adapted to compare the input voltage of the VCO to a reference voltage; and
   a control circuit coupled to the PLL circuit and configured to:
      output, based on an output of the comparator, both a VCO setting to the VCO and a corresponding charge pump current setting to the PFD/CP circuit, to set the input voltage of the VCO substantially equal to the reference voltage and to maintain a substantially constant PLL bandwidth.

2. The apparatus of claim 1 wherein the phase frequency detector/charge pump (PFD/CP) circuit comprises a PFD/CP circuit adapted to provide a charge pump current based on the charge pump current setting.

3. The apparatus of claim 1 wherein the voltage controlled oscillator (VCO) comprises a VCO having the input voltage of the VCO coupled to an output of the PFD/CP circuit, the VCO adapted to generate a VCO output frequency based on the input voltage of the VCO and a VCO setting.

4. The apparatus of claim 3 wherein the VCO comprises one or more of a variable resistor, variable capacitor, or a variable inductor, and wherein the variable resistor, capacitor or inductor is adjusted based on the VCO setting.

5. The apparatus of claim 1 wherein the comparator is configured to:
   compare the input voltage of the VCO to the reference voltage; and
   output a difference signal.

6. The apparatus of claim 1 wherein the control circuit is configured to output, based on an output of the comparator, both a VCO setting to the VCO and a corresponding charge pump current setting to the PFD/CP circuit, to set the input voltage of the VCO substantially equal to the reference voltage and to offset a change in a VCO gain while maintaining a substantially constant PLL bandwidth.

7. The apparatus of claim 1 wherein the control circuit is configured to output, based on an output of the comparator, a VCO setting to the VCO to set the input voltage of the VCO substantially equal to the reference voltage and a corresponding charge pump current setting to the PFD/CP circuit to maintain a substantially constant PLL bandwidth.

8. The apparatus of claim 1 wherein the PLL circuit comprises a frequency divider coupled to the VCO and the PFD/CP circuit, wherein the control circuit is configured to:
   output an updated VCO setting based on an output of the comparator, the updated VCO setting to set the input voltage of the VCO substantially equal to the reference voltage;
   output an updated charge pump current setting corresponding to an updated VCO setting, the updated charge pump current setting to offset a change in a divider number N of the frequency divider or to offset a change in a gain of the VCO while maintaining a bandwidth of the PLL substantially constant.

9. The apparatus of claim 1, further comprising a loop filter coupled between the PFD/CP circuit and the VCO, the loop filter being configured to accumulate the charge pump current to generate the input voltage, the loop filter comprising a series of a first capacitor and a fixed resistor and a second capacitor, the series of the first capacitor and the fixed resistor being in parallel with the second capacitor.

* * * * *